United States Patent
Banerjee et al.

(10) Patent No.: US 9,728,629 B1
(45) Date of Patent: Aug. 8, 2017

(54) ELECTRONIC DEVICE INCLUDING A POLYCRYSTALLINE COMPOUND SEMICONDUCTOR LAYER AND A PROCESS OF FORMING THE SAME

(71) Applicant: SEMICONDUCTOR COMPONENTS INDUSTRIES, LLC, Phoenix, AZ (US)

(72) Inventors: Abhishek Banerjee, Mechelen (BE); Aurore Constant, Oudenaarde (BE); Peter Moens, Erwetegem (BE); Brice De Jaeger, Leuven (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/209,952

(22) Filed: Jul. 14, 2016

(51) Int. Cl.
| | |
|---|---|
| *H01L 29/04* | (2006.01) |
| *H01L 29/778* | (2006.01) |
| *H01L 29/20* | (2006.01) |
| *H01L 29/205* | (2006.01) |
| *H01L 29/66* | (2006.01) |

(52) U.S. Cl.
CPC .......... *H01L 29/7784* (2013.01); *H01L 29/04* (2013.01); *H01L 29/2003* (2013.01); *H01L 29/205* (2013.01); *H01L 29/66462* (2013.01)

(58) Field of Classification Search
CPC ... H01L 29/04; H01L 29/2003; H01L 29/205; H01L 29/66462
USPC ................................ 257/51, 74, 75
See application file for complete search history.

(56) References Cited

U.S. PATENT DOCUMENTS 8,759,881 B2 * 6/2014 Bethoux ............... H01L 21/187
257/201

OTHER PUBLICATIONS

Park, Pil Sung, et al. "Recess-Free Nonalloyed Ohmic Contacts on Graded AlGaN Heterojunction FETs". IEEE Election Device Letters, vol. 36, No. 3, Mar. 3, 2015, pp. 226-228.

* cited by examiner

*Primary Examiner* — Tan N Tran
(74) *Attorney, Agent, or Firm* — Abel Law Group, LLP

(57) ABSTRACT

An electronic device can include a substrate having a primary surface; a monocrystalline semiconductor film overlying the primary surface of the substrate; and a polycrystalline compound semiconductor layer adjacent to the monocrystalline semiconductor film. In an embodiment, the polycrystalline compound semiconductor layer has a dopant concentration at most $1 \times 10^{16}$ atoms/cm$^3$, a donor concentration of greater than $1 \times 10^{17}$ donors/cm$^3$, and is part of a contact of an electrode of a transistor. In another embodiment, the electronic device can further include an interconnect over the polycrystalline compound semiconductor layer, wherein a combination of the interconnect and polycrystalline compound semiconductor layer form an ohmic contact. In a further embodiment, a polycrystalline compound semiconductor layer can be adjacent to the monocrystalline semiconductor film, wherein an energy level of a conduction band of the polycrystalline compound semiconductor layer is lower than its Fermi energy level.

19 Claims, 3 Drawing Sheets

ELECTRONIC DEVICE INCLUDING A POLYCRYSTALLINE COMPOUND SEMICONDUCTOR LAYER AND A PROCESS OF FORMING THE SAME

FIELD OF THE DISCLOSURE

The present disclosure relates to electronic devices and processes of forming electronic devices including polycrystalline compound semiconductor layers and processes of forming the same.

RELATED ART

Compound semiconductor materials are becoming more prevalent in providing performance that cannot be achieved with silicon devices. GaN is a promising material for allowing power devices. However, forming ohmic contacts to a monocrystalline GaN layer can involve annealing at a very high temperature. For Al-based contacts, annealing may be performed at a temperature in a range of 800° C. to 900° C. and may result in metal pits through an AlGaN barrier film and metal morphology instability. Alternatively, a heavily $N^+$ doped layer can be used but involves annealing at a temperature of at least 1000° C. for a long period of time to activate the dopant. Such an anneal can lead to degradation of one or more of the underlying layers and substrates. Good contact resistance without the complications described above regarding high temperature processing is desired.

BRIEF DESCRIPTION OF THE DRAWINGS

Embodiments are illustrated by way of example and are not limited in the accompanying figures.

Figure 1:
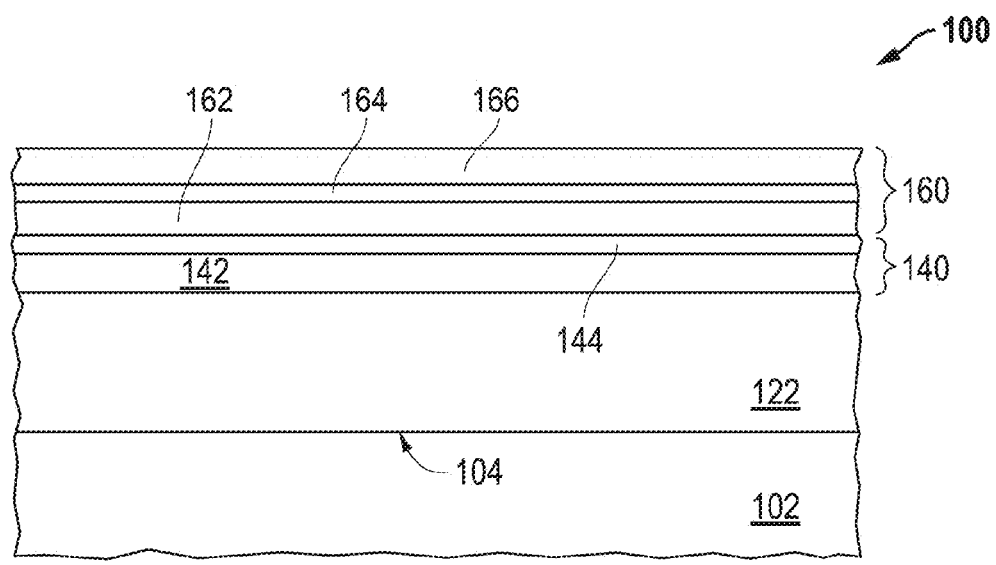
FIG. 1 includes an illustration of a cross-sectional view of a portion of a workpiece including a substrate, a nucleation layer, a semiconductor layer, and a dielectric layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_yGa_{(1-y)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier concentration" or "dopant concentration", when referring to a layer, a film, or a region, is intended to mean an average concentration for such layer, film, or region.

Group numbers corresponding to columns within the Periodic Table of Elements based on the IUPAC Periodic Table of Elements, version dated Jan. 21, 2011.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive- or and not to an exclusive- or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "approximately" or "substantially" means that a value of an element has a parameter that is expected to be close to a stated value or position. However, as is well known in the art, there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or in the Detailed Description, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a substrate having a primary surface; a monocrystalline semiconductor film overlying the primary surface of the substrate; and a polycrystalline compound semiconductor layer adjacent to the monocrystalline semiconductor film. In an embodiment, the polycrystalline compound semiconductor layer has a dopant concentration of at most $1\times10^{16}$ atoms/cm$^3$, a donor concentration of greater than $1\times10^{17}$ donors/cm$^3$, and is part of a contact of an electrode of a transistor. In another embodiment, the electronic device can further include an interconnect over the polycrystalline compound semiconductor layer, wherein a combination of the interconnect and polycrystalline compound semiconductor layer form an ohmic contact. In a further embodiment, a polycrystalline compound semiconductor layer can be adjacent to the monocrystalline semiconductor film, wherein an energy level of a conduction band of the polycrystalline compound semiconductor layer is lower than its Fermi energy level.

Although not to be bound by theory, the polycrystalline compound semiconductor layer can have more vacancies that act as donors and have a higher donor concentration as compared to a monocrystalline semiconductor layer that has the same dopant concentration as the polycrystalline compound semiconductor material. Accordingly, the energy of the conduction band may be lower at a region adjacent to the interface with a metal-containing layer. A depletion layer formed adjacent to the metal-semiconductor interface can be decreased, and the thermionic field can be sufficiently thin so that electrons can tunnel through the depletion layer. Accordingly, a contact can be an ohmic contact, rather than a Schottky contact, without the need for a dopant and its corresponding high temperature anneal to activate the dopant.

FIG. 1 includes an illustration of a cross-sectional view of a portion of a workpiece 100 that includes a substrate 102, a buffer layer 122, a semiconductor layer 140 that includes a channel film 142 and a barrier film 144, and a dielectric layer 160 that includes a gate dielectric film 162, an intermediate film 164, and a capping film 166. The substrate 104 has a primary surface 102 and can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface 104 can be selected depending upon the composition of the semiconductor layer 140 that will be subsequently formed over the substrate 102. The buffer layer 122 can help to epitaxially grow the semiconductor layer 140.

The composition of the buffer layer 122 may depend on the composition of the channel film 142. In an embodiment, the channel film 142 includes GaN, and the buffer layer 122 includes AlGaN. The composition of the buffer layer 122 can be changed as a function of thickness, such that the buffer layer 122 has a relatively greater aluminum content closer to the substrate 102 and relatively greater gallium content closer to the channel film 142. In a particular embodiment, the cation (metal atoms) content in the buffer layer 122 near the substrate 102 can be 10% to 100% Al with the remainder Ga, and the cation content in the buffer layer 122 near the channel film 142 can be 0% to 50% Al with the remainder Ga. In an embodiment, the uppermost portion of the buffer layer 122 can include GaN with a p-type dopant concentration of at least $1\times10^{19}$ atoms/cm$^3$. The buffer layer 122 can have a thickness in a range of approximately 1 micron to 5 microns.

The semiconductor layer 140 includes the channel film 142 and the barrier film 144, each of which includes a monocrystalline semiconductor material. The channel film 142 can include GaN and have a thickness in a range of approximately 20 nm to 4000 nm. The barrier film 144 can be used to help reduce the likelihood of migration of contaminants or other materials between one or more films underlying the barrier film 144 and the dielectric layer 160. In a particular embodiment, the barrier film 144 can include $Al_yGa_{(1-y)}N$, wherein $0.05 \leq y \leq 0.3$. The barrier film 144 can have a thickness in a range of approximately 2 to 30 nm. The semiconductor layer 140 is formed using an epitaxial growth technique, and thus the channel film 142 and barrier film 144, and at least a portion of the buffer layer 122 can be monocrystalline. In a particular embodiment, metal-containing films can be formed using metalorganic chemical vapor deposition. In another embodiment, different composition for the semiconductor layer 140 may be used, e.g., InAlGaN, InP, or the like.

The dielectric layer 160 can include a gate dielectric film 162, an intermediate film 164, and a capping film 166. In an embodiment, the gate dielectric film 162 can be formed to protect the underlying layers present within the workpiece 100. In an embodiment, the gate dielectric film 162 can include a silicon nitride, an aluminum oxide, a zirconium oxide, a hafnium oxide, a niobium oxide, another suitable dielectric material, or any combination thereof and have a thickness in a range of 5 nm to 40 nm. The intermediate film 164 can act as an etch-stop layer when etching the capping film 166. In an embodiment, the intermediate film 164 can include AlN and have a thickness in a range of 2 nm to 20 nm. The capping film 166 can protect the gate dielectric film 162. In an embodiment, the capping film 166 can include silicon nitride and have a thickness in a range of 20 nm to 500 nm. In another embodiment, the dielectric layer 160 can include fewer or more films that may have the same or different compositions as described. When the intermediate film 164 includes AlN, an optional $Al_2O_3$ film (not illustrated) can be formed by oxidizing a portion of the intermediate film 164 in an oxidizing ambient, such as $O_2$, $N_2O$, or the like. The dielectric layer 160 or any films of the dielectric layer 160 can be formed using a chemical or physical vapor technique.

In an embodiment, the buffer layer 122, the semiconductor layer 140, and the dielectric layer 160 are formed without exposing the workpiece to air or another oxygen-containing gas. Thus, the layers and films can be formed little or no oxide at an interface between any of the layers and films. In another embodiment, the workpiece may be exposed to air between forming any one or more of the films or layers. If an interfacial oxide is not to remain in the finished device, the interfacial oxide may be reduced in a reducing ambient or etched, for example, back sputtering, to remove the interfacial oxide before forming the subsequent layer or film. In still another embodiment, an oxide film may be formed and remain. For example, after forming the gate dielectric film 162, the workpiece may be exposed to air before forming the capping film 166.

Figure 2:
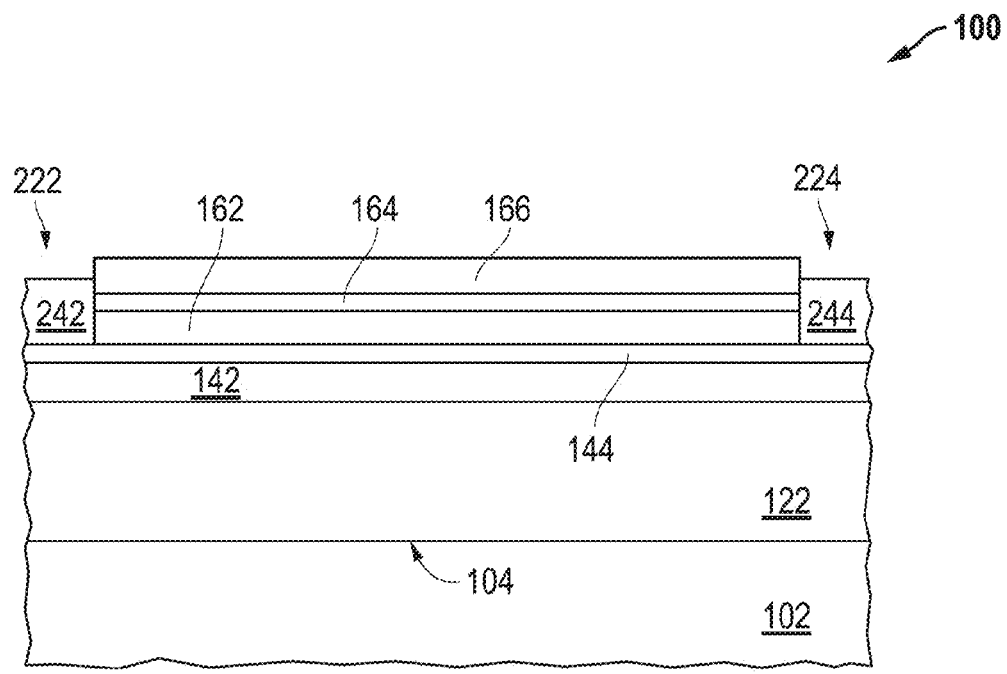
FIG. 2 includes an illustration of a cross-sectional view of the workpiece of FIG. 1 after patterning the dielectric layer and forming a polycrystalline compound semiconductor layer that includes source and drain contacts.

FIG. 2 includes an illustration of a cross-sectional view of the workpiece of FIG. 1 after patterning the dielectric layer 160 to form a source contact opening 222, a drain contact opening 224, a source contact 242, and a drain contact 244. A resist layer (not illustrated) is formed over the workpiece and the gate dielectric layer 160 is patterned to define the source contact opening 222 and the drain contact opening 224. The etching of the films 144 and 164 can be performed using reactive ion etching with a chlorine-containing gas, such as $Cl_2$, $BCl_3$, HCl, or the like. The etching of the films 162 and 166 can be performed using reactive ion etching with a fluorine-containing gas, such as $SF_6$, $CHF_3$, $CF_4$, or the like. The etching can be performed as a timed etch, using endpoint detection, or a combination of endpoint detection along with a timed overetch. The etch stops on or within the barrier film 144 or be continued until the channel film 142 is reached.

The source and drain contacts 242 and 244 are formed within the source and drain contact openings 222 and 224, respectively. The source and drain contacts 242 and 244 can include a polycrystalline compound semiconductor material, and in a particular embodiment may be a III-V semiconductor material, and in a more particular embodiment, can be a III-N semiconductor material. In an embodiment, the polycrystalline compound semiconductor material can be same as the channel film 142, such as $Al_{(1-x)}Ga_xN$, wherein $0<x\leq1$. In a particular embodiment, the channel film 142 includes monocrystalline GaN, and the source and drain contacts 242 and 244 include polycrystalline GaN. The dopant concentration of the channel film 142 and the source and drain contacts 242 and 244 may be at most $1\times10^{16}$ atoms/cm$^3$ and, in a more particular embodiment, may be undoped.

Figure 3:
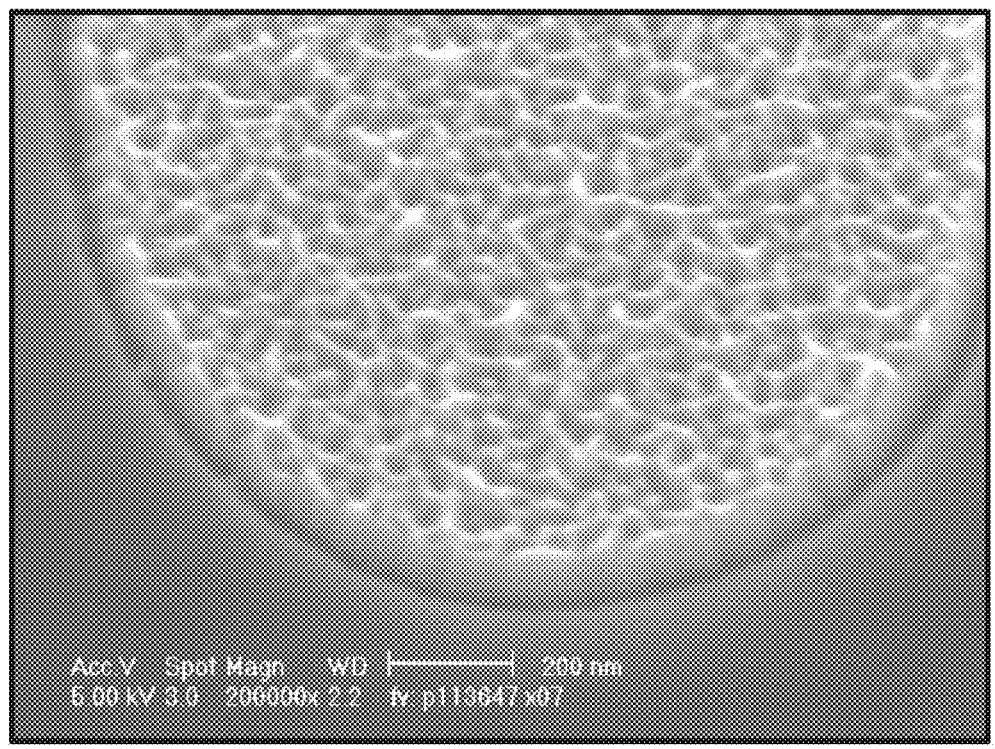
FIG. 3 includes a scanning electron microscope picture of a polycrystalline GaN layer FIG. 4 includes an illustration of a cross-sectional view of the workpiece of FIG. 2 after forming interconnects and a gate electrode.

The polycrystalline compound semiconductor material of the source and drain contacts 242 and 244 has significantly more vacancies as compared to its corresponding monocrystalline semiconductor material. FIG. 3 includes a scanning electron microscope picture of a polycrystalline GaN layer showing a relatively high number of defects that may cause the relatively high number of vacancies. The vacancies can be donors, and therefore, the density of donors can be sufficiently high to form a contact that behaves more like an ohmic contact to a subsequently-formed metal layer without needing a dopant and its corresponding high temperature anneal (over 1000° C.) needed to activate the dopant. The source and drain contacts 242 and 244 can have a donor concentration of at least $1\times10^{17}$ donors/cm$^3$, at least $1\times10^{18}$ donors/cm$^3$, or at least $1\times10^{19}$ donors/cm$^3$.

The source and drain contacts 242 and 244 can be parts of a polycrystalline compound semiconductor layer that is selectively grown within the source and drain contact openings 222 and 224. In another embodiment, the polycrystalline compound semiconductor layer can be deposited over the exposed surface of the workpiece 100 and patterned to define the source and drain contacts 242 and 244. The polycrystalline compound semiconductor layer can be formed at a temperature less than a temperature used to grow a monocrystalline semiconductor film having the same composition. In an embodiment, the polycrystalline compound semiconductor layer can be formed at a temperature of at most 900° C. In another embodiment, the polycrystalline compound semiconductor layer may be formed at a temperature of at most 600° C. As the temperature of formation is decreased, the layer will have more defect, and thus, more vacancies. A lower temperature limit for forming the layer is not known, but other considerations may effectively limit the lower temperature. For example, the deposition rate may be unacceptably low, vapor phase nucleation may occur and result in too many particles, or the like. For example, the temperature may be at least 400° C. However, the reaction may or may not be plasma assisted. Plasma assistance may allow a lower temperature to be used. Furthermore, a different gallium source gas may be used. For example, $Ga(CH_3)_3$ may be replaced with $Ga_2H_6$, or another gallium-containing material. Thus, the polycrystalline compound semiconductor may be formed at a temperature as low as 200° C., 100° C., or even lower.

A resist layer (not illustrated) is formed over the workpiece and is patterned to define an opening over a location where a gate electrode will be formed. Exposed portions of capping film 166 and the intermediate film 164 are etched to define a gate electrode opening. The silicon nitride of capping film 166 can be etched selective to the intermediate film 164. In an embodiment, the etch can be performed using reactive ion etching using any of the etch chemistries as previously described. The etch may be performed using a timed etch, endpoint detection, or a combination of endpoint detection and a timed overetch. In another embodiment, the intermediate film 164 can be removed from within in the gate opening.

Figure 4:
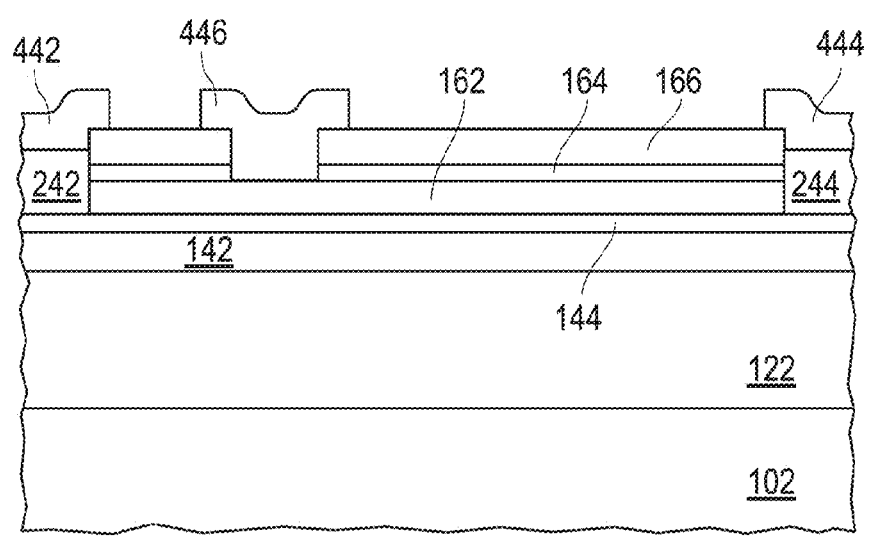

FIG. 4 includes an illustration of a cross-sectional view of a portion of the workpiece of FIG. 2 after forming interconnects 442 and 444 and a gate electrode 446. A conductive layer is deposited over the workpiece, including the source and drain contacts 242 and 244, and within the gate electrode opening. The conductive layer has a composition selected to provide a proper work function for the transistor being formed. The conductive layer can include Ti, TiN, Al, Pd, Pt, W, Au, Ni, or a stack or any combination thereof. In another embodiment, the conductive layer is typically at least 50 wt % aluminum, copper, a noble metal, or an alloy of any of the foregoing. The conductive layer has a thickness in a range of 50 nm to 500 nm. The conductive layer is patterned to form the interconnect 442 over the source contact 242, the interconnect 444 over the drain contact 244, and the gate electrode 446 within the gate electrode opening.

Figure 5:
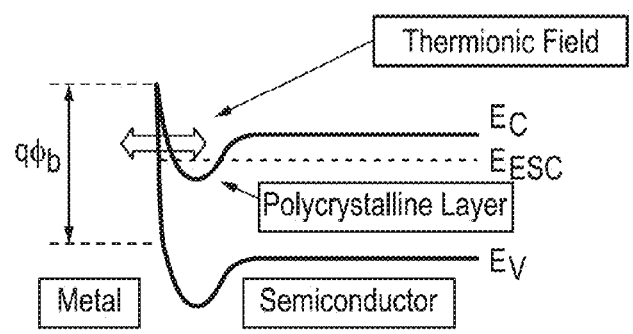
FIG. 5 includes a plot of energy levels of a metal and polycrystalline compound semiconductor layer adjacent to their interface.

A source electrode can include the source contact 242 and the interconnect 442, and a drain electrode can include the drain contact 244 and the interconnect 444. FIG. 5 includes a plot of energy bands as a function of distance from a metal interface into the polycrystalline compound semiconductor layer of the source and drain contacts 242 and 244. The polycrystalline compound semiconductor layer has a conduction energy band that is lower than the Fermi energy band for the compound semiconductor material. This allows the depletion layer formed adjacent to the metal-semiconductor interface (i.e., the interfaces between the interconnects and their corresponding underlying contacts) to decrease, and the thermionic field is sufficiently thin so that electrons can tunnel through the depletion layer.

Figure 6:
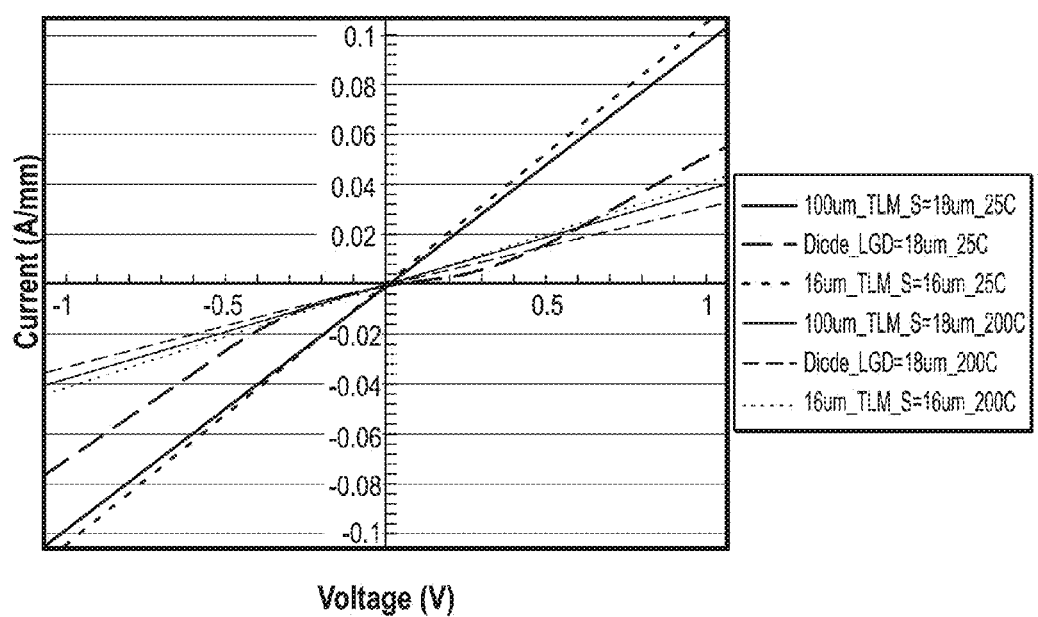
FIG. 6 includes a plot of current as a function of voltage for diode and transmission line method resistor test structures.

A diode structure and a transmission line method (LTM) resistor structure, wherein L=16 microns and 100 microns, are used to test the combination of the polycrystalline compound semiconductor material and metal interconnects for its IV characteristics. FIG. 6 includes a plot of IV characteristics at room temperature (25° C.) and 200° C. The diode structure at room temperature has a shallow S shape. One or two monolayers or oxide may be formed at the interface between the polycrystalline compound semiconductor layer and interconnect (metal) due to oxygen or water deadsorbing from surfaces within the deposition chamber when forming the structure. Below −0.5 V and above +0.5 V, the IV characteristics are linear. The relatively shallower portion near 0 V may be due to tunneling through the one or two monolayers of oxide at the interface. The TLM resistor structures show little or no flattening of the IV curves near 0 V. Accordingly, the test structures show an ohmic contact is formed at the interface between the polycrystalline compound semiconductor layer of each of the source and drain contacts 242 and 244 and its overlying interconnects 422 and 424 without the need for a dopant and its corresponding high temperature anneal to activate the dopant.

In the embodiment as illustrated, the transistor is a depletion-mode transistor. In another embodiment, an enhancement-mode transistor may be formed. In such an embodiment, another gate dielectric film may be formed as part of the dielectric layer 160 or within the gate electrode opening before forming the gate electrode 446. In another embodiment, a p-type GaN layer may be formed within the gate electrode opening before forming the gate electrode 446.

Processing is continued to form a substantially completed device. One or more insulating layers and levels of interconnects can be formed if needed or desired. The upper level interconnects can include source, gate, and drain shielding plates to control better electrical fields within the channel film 142, reduce parasitic drain-to-gate capacitance, or other similar electronic properties. Each of the insulating layers can include one or more films of oxide, nitride, or oxynitride and have a thickness in a range of 0.2 microns to 4 microns. Each of the interconnects can include one or more films of conductive material. The interconnects are typically at least 50 wt % aluminum, copper, a noble metal, or an alloy of any of the foregoing. A passivation layer (not illustrated) may be formed over the uppermost level of interconnects.

Embodiments as described herein can help to form contacts for the source and drain electrodes that allow for tunneling through a depletion layer, and thus, the contacts are ohmic contacts rather than Schottky contacts. The contacts can be formed without doping or having to perform a high temperature alloy. Thus, after forming the polycrystalline compound semiconductor material for the source and drain contacts 242 and 244, the workpiece 100 does not need to be exposed to a high temperature anneal, as would typically be used if a dopant would be used to form the ohmic contact. Thus, the metal pitting and degradation of any layers can be reduced or eliminated.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device comprising:
a substrate having a primary surface;
a monocrystalline semiconductor film overlying the primary surface of the substrate; and
a polycrystalline compound semiconductor layer adjacent to the monocrystalline semiconductor film, wherein the polycrystalline compound semiconductor layer has a dopant concentration of at most $1\times10^{16}$ atoms/cm$^3$, a donor concentration of greater than $1\times10^{17}$ donors/cm$^3$, and is a part of a contact of an electrode of a transistor.

Embodiment 2

The electronic device of Embodiment 1, wherein each of the monocrystalline semiconductor film and the polycrystalline compound semiconductor layer includes a III-V semiconductor material.

Embodiment 3

The electronic device of Embodiment 1, wherein the monocrystalline semiconductor film and the polycrystalline compound semiconductor layer include a same III-N semiconductor material.

Embodiment 4

The electronic device of Embodiment 1, wherein the polycrystalline compound semiconductor layer is undoped.

Embodiment 5

The electronic device of Embodiment 1, further comprising an interconnect, wherein a combination of the interconnect and polycrystalline compound semiconductor layer form an ohmic contact.

Embodiment 6

The electronic device of Embodiment 1, wherein the monocrystalline semiconductor film is a channel film of a transistor.

Embodiment 7

The electronic device of Embodiment 6, further comprising a barrier film overlying the channel film, wherein the barrier film has a different composition as compared to the channel film.

Embodiment 8

The electronic device of Embodiment 7, wherein the polycrystalline compound semiconductor layer is spaced apart from the channel film by at least a portion of the barrier layer.

Embodiment 9

The electronic device of Embodiment 7, wherein the polycrystalline compound semiconductor layer is no further than 70 nm away from the channel film.

Embodiment 10

The electronic device of Embodiment 7, wherein a portion of the polycrystalline compound semiconductor layer extends through the barrier film and contacts the channel film.

Embodiment 11

The electronic device of Embodiment 7, wherein the channel film is a GaN film, the polycrystalline compound semiconductor layer is a GaN layer, and the barrier film includes $Al_yGa_{(1-y)}N$, wherein $0.05 \leq y \leq 0.3$.

Embodiment 12

The electronic device of Embodiment 11, further comprising a gate electrode, wherein:
  a first portion of the polycrystalline compound semiconductor layer is part of a source electrode;
  a second portion of the polycrystalline compound semiconductor layer is part of a drain electrode; and
  the channel film, the source, drain, and gate electrodes are parts of the transistor.

Embodiment 13

An electronic device comprising:
  a substrate having a primary surface;
  a monocrystalline semiconductor film overlying the primary surface of the substrate; and
  a polycrystalline compound semiconductor layer adjacent to the monocrystalline semiconductor film, wherein an energy level of a conduction band of the polycrystalline compound semiconductor layer is lower than its Fermi energy level.

Embodiment 14

A process of forming an electronic device comprising:
  forming a monocrystalline semiconductor film over a primary surface of a substrate;
  forming a polycrystalline compound semiconductor layer over the monocrystalline semiconductor film, wherein the polycrystalline compound semiconductor layer has a dopant concentration no greater than $1 \times 10^{16}$ atoms/cm3 and a donor concentration of greater than $1 \times 10^{17}$ donors/cm$^3$, and
  forming an interconnect over the polycrystalline compound semiconductor layer, wherein a combination of the interconnect and polycrystalline compound semiconductor layer form an ohmic contact.

Embodiment 15

The process of Embodiment 14, wherein the monocrystalline semiconductor film and the polycrystalline compound semiconductor layer include a III-N semiconductor material.

Embodiment 16

The process of Embodiment 15, wherein each of the monocrystalline semiconductor film and the polycrystalline compound semiconductor layer includes GaN.

Embodiment 17

The process of Embodiment 16, further comprising:
  forming a barrier film over the monocrystalline semiconductor film, wherein the barrier film includes $Al_yGa_{(1-y)}N$, wherein $0.05 \leq y \leq 0.3$; and
  forming a gate electrode over the barrier film.

Embodiment 18

The process of Embodiment 17, wherein:
  portions of the polycrystalline compound semiconductor layer comprise a source electrode and a drain electrode, and
  the channel film, the source, drain, and gate electrodes are parts of a same transistor.

Embodiment 19

The process of Embodiment 14, wherein forming the polycrystalline compound semiconductor layer is performed at a temperature no greater than 900° C.

Embodiment 20

The process of Embodiment 14, wherein the polycrystalline compound semiconductor layer is not formed nor exposed to a temperature of at least 1000° C. during any part of forming the electronic device.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination.

Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
    a substrate having a primary surface;
    a monocrystalline semiconductor film overlying the primary surface of the substrate; and
    a polycrystalline compound semiconductor layer adjacent to the monocrystalline semiconductor film, wherein the polycrystalline compound semiconductor layer has a dopant concentration of at most $1\times10^{16}$ atoms/cm$^3$, a donor concentration of greater than $1\times10^{17}$ donors/cm$^3$, and is a part of a contact of an electrode of a transistor.

2. The electronic device of claim 1, wherein each of the monocrystalline semiconductor film and the polycrystalline compound semiconductor layer includes a III-V semiconductor material.

3. The electronic device of claim 1, wherein the monocrystalline semiconductor film and the polycrystalline compound semiconductor layer include a same III-N semiconductor material.

4. The electronic device of claim 1, wherein the polycrystalline compound semiconductor layer is undoped.

5. The electronic device of claim 1, further comprising an interconnect, wherein a combination of the interconnect and polycrystalline compound semiconductor layer form an ohmic contact.

6. The electronic device of claim 1, wherein the monocrystalline semiconductor film is a channel film of a transistor.

7. The electronic device of claim 6, further comprising a barrier film overlying the channel film, wherein the barrier film has a different composition as compared to the channel film.

8. The electronic device of claim 7, wherein the polycrystalline compound semiconductor layer is spaced apart from the channel film by at least a portion of the barrier layer.

9. The electronic device of claim 7, wherein the polycrystalline compound semiconductor layer is no further than 70 nm away from the channel film.

10. The electronic device of claim 7, wherein a portion of the polycrystalline compound semiconductor layer extends through the barrier film and contacts the channel film.

11. The electronic device of claim 7, wherein the channel film is a GaN film, the polycrystalline compound semiconductor layer is a GaN layer, and the barrier film includes $Al_yGa_{(1-y)}N$, wherein $0.05 \leq y \leq 0.3$.

12. The electronic device of claim 11, further comprising a gate electrode, wherein:
    a first portion of the polycrystalline compound semiconductor layer is part of a source electrode;
    a second portion of the polycrystalline compound semiconductor layer is part of a drain electrode; and
    the channel film, the source, drain, and gate electrodes are parts of the transistor.

13. A process of forming an electronic device comprising:
    forming a monocrystalline semiconductor film over a primary surface of a substrate;
    forming a polycrystalline compound semiconductor layer over the monocrystalline semiconductor film, wherein the polycrystalline compound semiconductor layer has a dopant concentration no greater than $1\times10^{16}$ atoms/cm$^3$ and a donor concentration of greater than $1\times10^{17}$ donors/cm$^3$, and
    forming an interconnect over the polycrystalline compound semiconductor layer, wherein a combination of the interconnect and polycrystalline compound semiconductor layer form an ohmic contact.

14. The process of claim 13, wherein the monocrystalline semiconductor film and the polycrystalline compound semiconductor layer include a III-N semiconductor material.

15. The process of claim 14, wherein each of the monocrystalline semiconductor film and the polycrystalline compound semiconductor layer includes GaN.

16. The process of claim 15, further comprising:
    forming a barrier film over the monocrystalline semiconductor film, wherein the barrier film includes $Al_yGa_{(1-y)}N$, wherein $0.05 \leq y \leq 0.3$; and
    forming a gate electrode over the barrier film.

17. The process of claim 16, wherein:
    portions of the polycrystalline compound semiconductor layer comprise a source electrode and a drain electrode, and
    the channel film, the source, drain, and gate electrodes are parts of a same transistor.

18. The process of claim 13, wherein forming the polycrystalline compound semiconductor layer is performed at a temperature no greater than 900° C.

19. The process of claim 13, wherein the polycrystalline compound semiconductor layer is not formed nor exposed to a temperature of at least 1000° C. during any part of forming the electronic device.

* * * * *